United States Patent [19]
Shenoy et al.

[11] Patent Number: 5,297,172
[45] Date of Patent: Mar. 22, 1994

[54] METHOD AND APPARATUS FOR CLOCK RECOVERY FOR DIGITALLY IMPLEMENTED MODEM

[75] Inventors: Ajit Shenoy, Germantown; Lin-nan Lee, Potomac; Michael K. Eng, Rockville, all of Md.

[73] Assignee: Comsat Corporation, Washington, D.C.

[21] Appl. No.: 791,052

[22] Filed: Apr. 11, 1991

[51] Int. Cl.⁵ .............................................. H04L 7/00
[52] U.S. Cl. ..................................... 375/118; 375/120
[58] Field of Search ............... 375/106, 113, 118, 101, 375/119, 120; 370/105.3, 105.4, 106

[56] References Cited
U.S. PATENT DOCUMENTS

| | | | |
|---|---|---|---|
| 3,935,535 | 1/1976 | Motley et al. | 333/18 |
| 3,962,637 | 6/1976 | Motley et al. | 333/18 |
| 4,216,543 | 8/1980 | Cagle et al. | 375/95 |
| 4,238,739 | 12/1980 | Mosley et al. | 331/12 |
| 4,376,309 | 3/1983 | Fenderson et al. | 375/101 |
| 4,419,760 | 12/1983 | Bjornholt | 375/120 |
| 4,516,079 | 5/1985 | York | 329/104 |
| 4,527,278 | 7/1985 | Deconche et al. | 375/97 |
| 4,583,048 | 4/1986 | Gumacos et al. | 329/122 |
| 4,597,089 | 6/1986 | Motley et al. | 375/15 |
| 4,627,080 | 12/1986 | Debus, Jr. | 375/101 |
| 4,642,573 | 2/1987 | Noda et al. | 329/50 |
| 4,847,876 | 7/1989 | Baumbach et al. | 375/113 |
| 4,888,793 | 12/1989 | Chanroo et al. | 375/84 |
| 5,052,026 | 9/1991 | Walley | 375/119 |

*Primary Examiner*—Curtis Kuntz
*Assistant Examiner*—T. Ghebretinsae
*Attorney, Agent, or Firm*—Sughrue, Mion, Zinn, Macpeak & Seas

[57] ABSTRACT

The correct sampling timing phase is obtained by a digital data receiver by averaging samples of the preamble of a received data burst and using the computed averages as addresses to a memory which stores correction values for the timing phase. The output of the memory is sent to a phase correction circuit for correcting the phase of the presently received data burst.

11 Claims, 3 Drawing Sheets

METHOD AND APPARATUS FOR CLOCK RECOVERY FOR DIGITALLY IMPLEMENTED MODEM

FIELD OF INVENTION

The present invention relates to a method and apparatus for acquiring the correct sampling timing for burst mode digital data transmission. The method and apparatus used results in acquisition using a minimum-sized overhead in terms of a synchronization preamble.

BACKGROUND OF THE INVENTION

In almost all digital data transmission systems, the receiver is required to sample the received waveform once per symbol in a relatively small interval in order to minimize the bit-error-rate (BER). If the transmission technique is optimized for bandwidth and power efficiency, a sampling instance corresponding to-the maximum of the "eye-opening" (a transition from a 0 to a 1 looks like an eye) usually provides the best performance.

For continuous transmission systems, the sampling clock is typically obtained from a clock recovery loop which derives the timing from zero crossings occurring during data transitions. The clock recovery loop is typically a phase-locked-loop (PLL). The loop bandwidth B of the PLL is chosen to maintain the steady-state jitter and initial acquisition time within a reasonable range.

For burst mode transmission, it is 104 is necessary to transmit a preamble which contains a sufficient number of data transitions for the clock recovery loop to detect before receiving valid data. Typically, the Preamble contains a sequence of alternating zeroes and ones (01010101 ... ). The length of this sequence is typically three times the loop time constant, 1/B, because a typical PLL takes this duration to settle.

A conventional burst mode sampling timing acquisition circuit is shown in FIG. 1. A received digital signal burst is input to the circuit at input terminal 106. The burst has been transmitted from a transmitter over an analog transmission channel thus rendering the originally digital burst into an analog form. The analog-to-digital (A/D) converter 100 performs the operation of reconverting the transmitted signal burst back into the digital format.

The frequency of the sampling clock which drives the A/D 100 (i.e., the sampling rate) is known at the receiver, since a standard rate is used. However, the phase of the clock is unknown at the receiver and the purpose of the circuit of FIG. 1 is to acquire the correct sampling phase, hereinafter referred to as the correct sampling timing phase.

As discussed above, in conventional systems a preamble composed of an alternating sequence of zeroes and ones is attached to the front end of a digital signal burst in order to provide a known signal burst portion for use in sampling timing (sampling phase) acquisition. This preamble must have a length, in conventional systems, of at least 3/B (where B is the bandwidth of the PLL), since the PLL requires that much time to settle.

After channel filtering is carried out by well-known techniques in order to remove other signals and out-of-band noise from the received signal burst, the burst is input to the circuit of FIG. 1 at terminal 106. The burst is then sampled by the A/D converter 100 which operates at an expected sampling rate. The A/D converter 100 samples the received signal twice per symbol. The demultiplexer 101 separates the samples and sends the odd samples, for example, onto demultiplexer output line 109, and the even samples, for example, onto demultiplexer output line 110.

The 10101010 . . . sequence of the preamble, if repeated for a sufficiently long duration, produces a sinusoidal waveform after channel filtering. This is because the channel filters are usually designed to be very tight in order to minimize the noise, and all higher order (third, fifth, etc.) harmonics are removed by the channel. This sinusoidal waveform has a frequency equal to half of the symbol rate. If the symbol timing is correct, four samples per cycle are obtained, two at zero-crossings, and two at the peaks.

The samples output onto the demultiplexer output line 110 represent samples which, at the correct sampling timing phase, would represent the peaks (both positive and negative in amplitude) of the sinusoidal wave mentioned above. These samples are sent to a transition detector 102 which outputs one of three values 1, 0, or +1 depending on whether the sample input to the transition detector 102 is closer to the maximum negative peak, the zero level or the maximum positive peak, respectively. The samples output from the demultiplexer on demultiplexer output line 109 correspond, at the correct sampling timing phase, to the zero crossing points of the above-mentioned sinusoidal wave.

A multiplier 103 receives as inputs the samples output from the demultiplexer on demultiplexer output line 109 and the output 111 of the transition detector 102. The output 112 of the multiplier 103 represents the amount of deviation from the correct sampling timing phase for the presently used sampling clock. The above-mentioned circuitry tests the samples exactly one symbol time apart for data transitions. If a transition occurs, an error voltage proportional to the sample near the transition (the sample output from the demultiplexer 101 onto demultiplexer output line 109) is fed through a low pass filter (LPF) 104 to a voltage-controlled-oscillator (VCO) 105.

The output of the VCO 105 is fed back to be used by the A/D converter 100 as a sampling clock signal. Thus, when the error voltages output from the multiplier 103 are sent to the VCO 105 through the LPF 104, these error voltages modify the phase of the sampling clock of the A/D converter so as to place the phase of the sampling clock closer to the correct sampling timing phase.

As mentioned above, in order to acquire the correct sampling timing phase by the above conventional system, a preamble of length 3/B is required. For certain burst messages, such as those generated by interactive computer-to-computer communications, network control, signaling, and acknowledgements, bursts lengths are inherently short. A long preamble adversely reduces the throughput of the system. This preamble length is the main disadvantage of the PLL method (FIG. 1) of obtaining the correct sampling timing phase.

An alternative approach uses a tuned filter. The received signal is first squared to remove modulation. During data transitions, the squared waveform has envelope fluctuation. A harmonic of the envelope fluctuation at the symbol rate, $R_s$ is obtained by passing this signal through a filter with noise bandwidth B and center frequency are equal to the symbol rate. The squaring operation, however, causes a loss of 6 dB in terms of signal-to-noise ratio. The standard deviation of the clock jitter in steady-state equals $1/\sqrt{E_sR_s/2N_0E}$ in radians. Typically, the tuned filter needs a preamble of length 1.25/B which is only 40 percent of that required by the PLL approach described above with respect to FIG. 1.

The tuned filter approach suffers from other drawbacks. Namely, narrow bandpass filters, needed for use in the tuned filter approach, usually require expensive stable precision components such as high-Q inductors.

SUMMARY OF THE INVENTION

An object of the present invention is to achieve correct sampling timing phase acquisition using a minimum amount of overhead in terms of a synchronization preamble.

A further object of the invention is to achieve correct sampling timing phase acquisition using a minimum amount of overhead in terms of a synchronization preamble and using relatively inexpensive receiver circuitry as compared to the circuitry used in the conventional tuned filter approach.

The above-mentioned objects are achieved by providing a method and apparatus for acquiring the correct sampling timing phase which uses, as a backdrop, the PLL type conventional system described above, but which involves major changes to the conventional PLL type system such changes allowing for a reduced preamble length and a reduced level of circuit complexity.

FIG. 2 shows a modified version of FIG. 1 in which the inventive features of the present invention have been added. Specifically, the samples output of the demultiplexer 101 of FIG. 1 on demultiplexer output line 109 are averaged by an averaging circuit 200. Simultaneously, the samples output onto demultiplexer output line 110 are averaged by an averaging circuit 201. These averages are used as addresses to a memory circuit 202 along lines 205 and 204. In response to the addresses, the memory circuit 202 outputs a correction value along line 203 which is then sent to the VCO 105 so as to correct the phase of the sampling clock during initial sampling timing phase acquisition.

BRIEF DESCRIPTION OF THE DRAWINGS

The following is a brief description of the drawings which are presented in order to clearly show the inventive features arrived at by the inventors.

DETAILED DESCRIPTION OF THE PREFERRED EMBODIMENTS

If the sample timing phase is correct, the four samples per cycle of the sinusoidal wave discussed above will occur at the following positions. Two samples will occur at the zero-crossings of the above-mentioned sinusoidal wave and two samples will occur at the peaks. Without channel noise, these samples assume the values 0, 1, 0, and −1, or sin 0°, sin 90°, sin 18°, and sin 270° as shown in FIG. 3a.

Figure 3B:
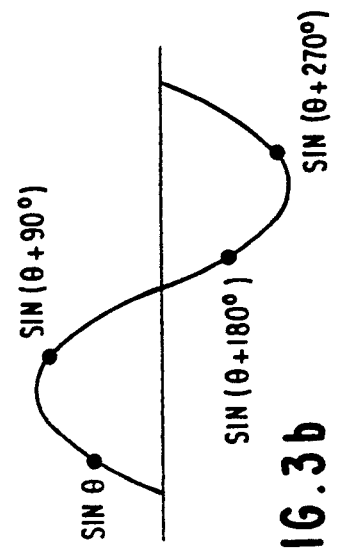
FIGS. 3a and 3b show waveforms displaying the values of the samples as a function of clock phase.

If the sampling time is off by an angle ($\theta$) with respect to the correct sampling timing phase, the four samples discussed above assume the values sin ($\theta$), sin($\theta$+90 °), sin($\theta$+180 °), and sin($\theta$+270 °). This is shown in FIG. 3b. Since sin($\theta$+90 °)=cos ($\theta$), the value of $\theta$ can be easily obtained by taking the ratio of r=sin($\theta$)/cos($\theta$), and finding $\theta$=arctan r. Because the clock frequency is four times this sinusoidal waveform, an adjustment of clock phase by 4 arctan (r) can easily move the sampling clock to the correct timing.

Figure 1:
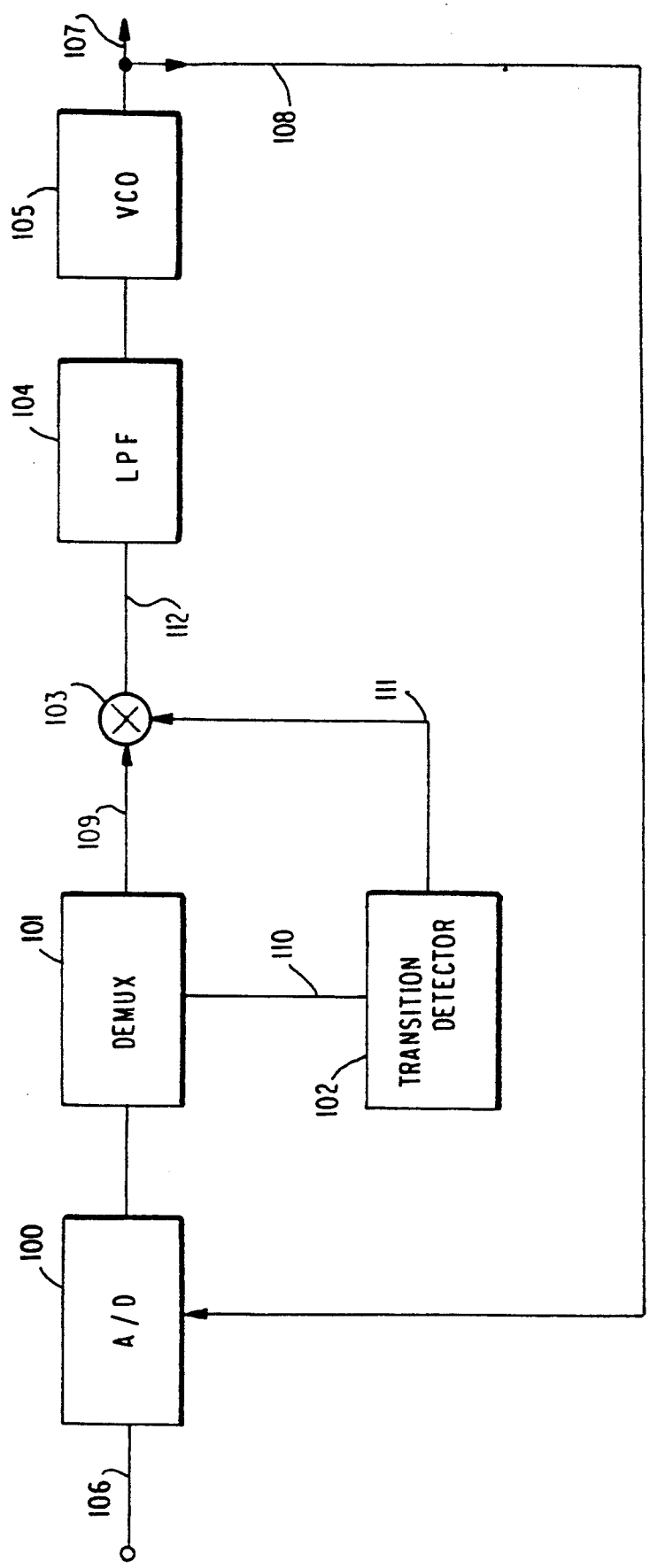
FIG. 1 shows a conventional PLL type sampling timing phase acquisition system.
Figure 3A:
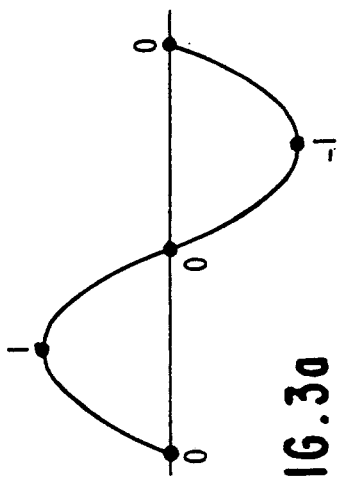

In FIG. 1 the group of samples output from the demultiplexer 101 on demultiplexer output line 109 correspond to the zero-crossings of the sinusoidal wave of FIG. 3a (the situation where the timing phase is correct). In FIG. 1 the group of samples output from the demultiplexer 101 on demultiplexer output line 110 correspond to the peaks of the sinusoidal wave of FIG. 3a. Thus, the samples output of the demultiplexer can be compared in order to quickly determine the amount of offset between the present sampling timing phase and the correct sampling timing phase based on the above arctan equation.

Figure 2:
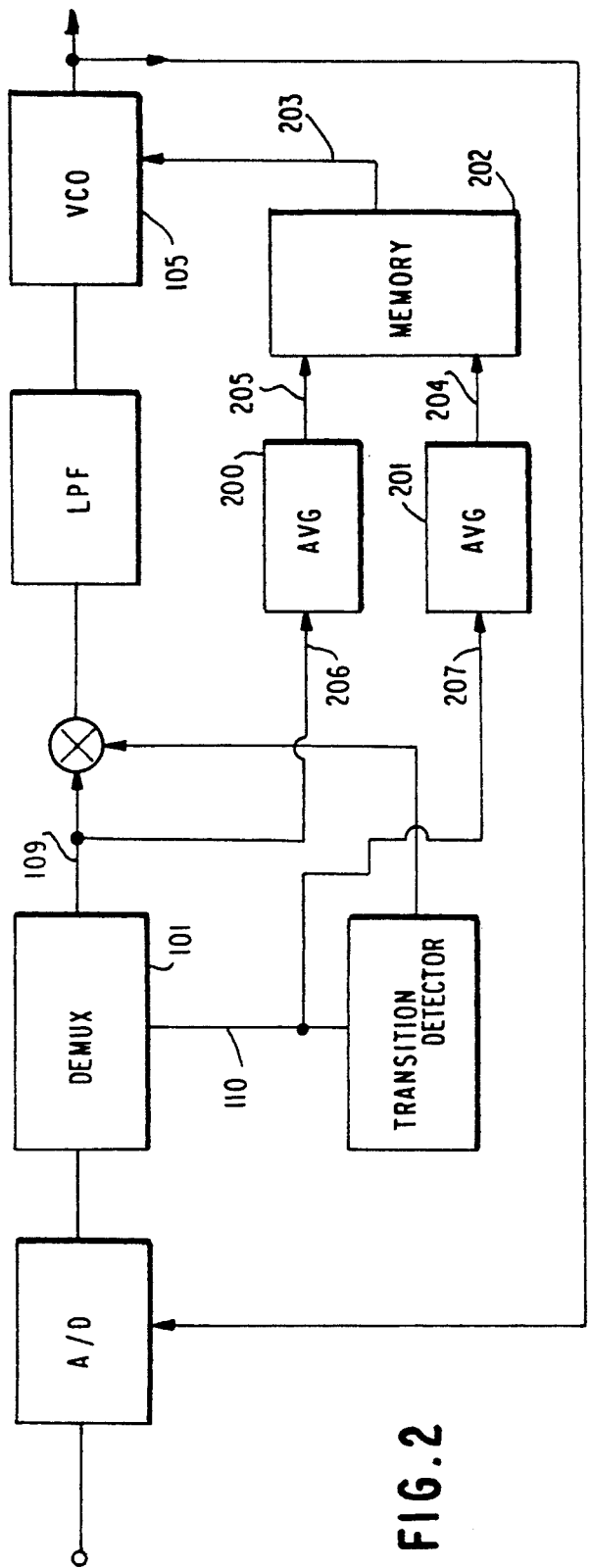
FIG. 2 shows a block diagram of a sampling timing phase acquisition system according to the present invention.

Specifically, as shown in FIG. 2, the samples output onto line 109 are sent to an averaging circuit 200 which computes the average of the absolute values of the n/2 samples output from the demultiplexer. There are n samples total and the output line 109 contains, for example, the n/2 odd-numbered samples and the output line 110 contains, for example, the n/2 even-numbered samples. The absolute values of the n/2 even-numbered samples output from the demultiplexer onto demultiplexer output line 110 are averaged by averaging circuit 201. The above averaging takes place during the time that the preamble, made up of n samples, is being processed by the receiver.

Thus, the received signal, after channel filtering, is sampled twice per symbol. The absolute values of these samples are collected in two groups, the even number samples, $e_i$ and the odd number samples, $o_i$. The average magnitude of the even number samples over n symbol durations $$\bar{e} = \frac{1}{n} \sum_{i=1}^{n} |e_i|$$

and that of the odd number samples $$\bar{o} = \frac{1}{n} \sum_{i=1}^{n} |o_i|$$

over n symbol durations are computed. Instead of taking the ratio $\bar{e}/\bar{o}$ and computing the phase adjustment by the arctan function, an alternative method which is much less susceptible to error is used. The value of $\bar{e}$ and $\bar{o}$ are quantized. A table which stores the precomputed phase angle adjustment for all possible combinations of $\bar{e}$ and $\bar{o}$ is used to determine the amount of correction needed. This table is shown in FIG. 2 as memory circuit 202. The output of the averaging circuits 200 and 201 are used as addresses 205 and 204 , respectively, to the memory circuit 202. The correction value that is output of the memory circuit 202 is introduced to the digitally controlled VCO 105 by resetting a dividing counter of the VCO 105 in a well known fashion in order to adjust the phase of the sampling timing clock to the correct value.

The technique assumes a VCO whose phase can be controlled digitally. This is most frequently accomplished by running an analog VCO at a higher frequency and then dividing it down with a resettable digital counter as is well known in the art.

After the above-mentioned adjusting of the VCO 105 by means of the memory circuit 202 has been accomplished, the averaging circuits 200 and 201 no longer perform their averaging function. This point in time corresponds to the time when the preamble of the burst has passed and the data section of the burst is beginning to be processed by the receiver. At this point, the conventional PLL type system of FIG. 1 is used to maintain synchronization and the additional circuit elements which have been added by the inventors to FIG. 1 (such additions being shown in FIG. 2) are no longer used. The circuit of FIG. 1 is also known as a closed decision feedback loop. The closed decision feedback loop takes the responsibility of maintaining correct sampling timing phase from this point on. Even if there is a small residual timing error at the time when the loop is closed (i.e., when the circuit of FIG. 2 is reduced to the circuit of FIG. 1), the decision feedback loop will be able to correct it without difficulty.

Now, the specifics of exactly when and how the receiver switches from the open loop acquisition operation of the present invention (the additions to FIG. 1 made in FIG. 2) to the closed loop acquisition operation (the conventional technique of FIG. 1) will be described.

A received data burst consists of a beginning section called a preamble, as discussed above, made up of alternating ones and zeroed. This section exists for a predetermined period of time, that is, the length of the preamble (the exact number of alternating zeroes and ones) is predetermined. Therefore, when the receiver receives the data burst, the receiver can be programmed to expect exactly how long the preamble section of the data burst will last. A timer is present in the receiver and the timer is programmed to count up to a time count corresponding to the predetermined length of the preamble. If the receiver detects that the timer has not reached that time count, then the receiver knows that it is still processing the preamble section of the data burst using the open loop acquisition system which characterizes the present invention (the circuitry including the averaging circuits 200 and 201 and the memory circuit 202).

When, however, the receiver detects that the timer has reached the time count, then the receiver knows that the preamble section of the data burst has passed and that the data section of the data burst is now about to be processed by the receiver. At this time the receiver switches from the open loop acquisition system of the present invention (the circuit of FIG. 2) to the closed loop acquisition system of the prior art (the circuit of FIG. 1).

Another way to detect when the preamble has passed and to switch, at that time, from the open loop mode to the closed loop mode will now be described with reference to FIG. 4 which shows a more detailed version of the circuit shown in FIG. 2.

Figure 4:
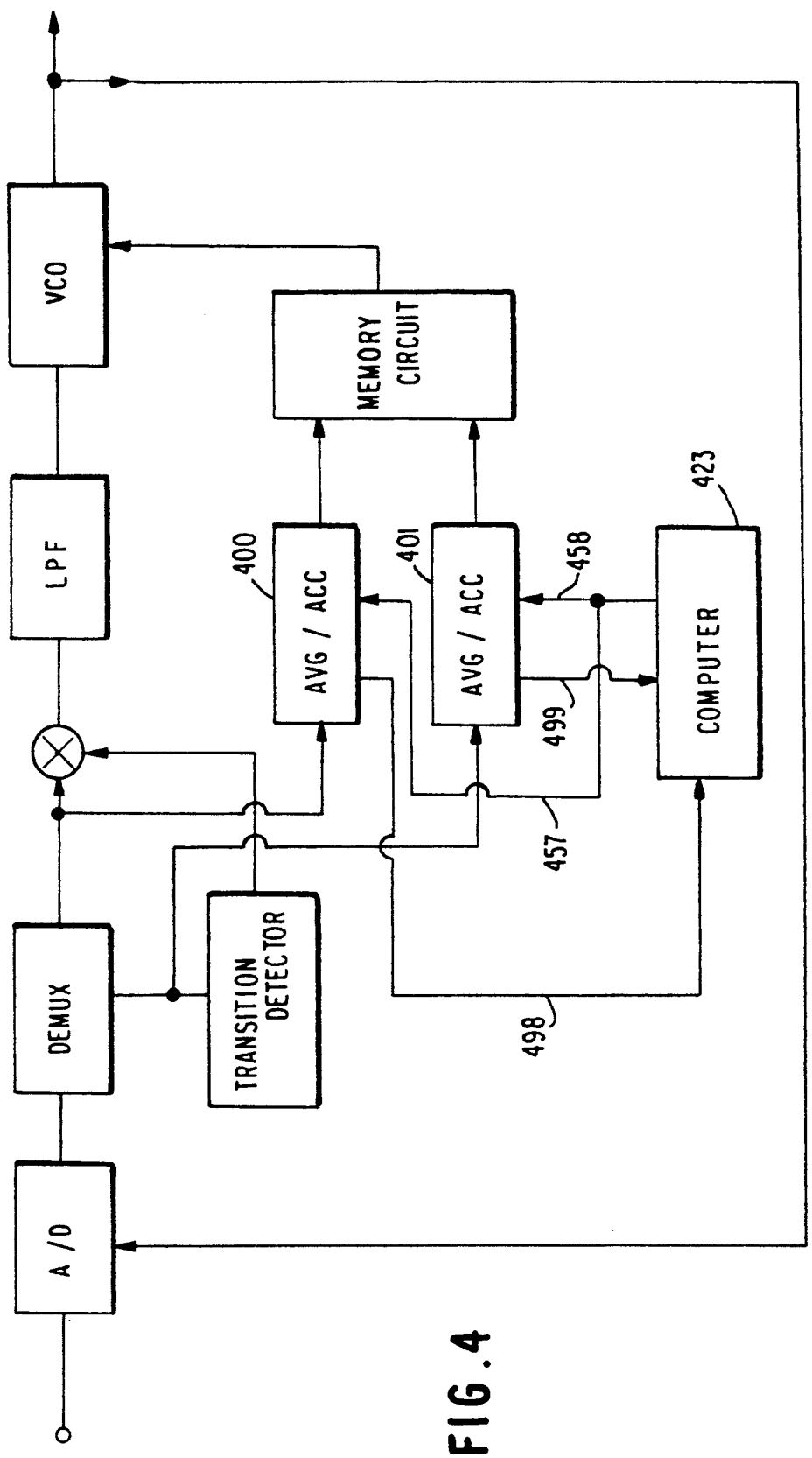
FIG. 4 shows a more detailed version of the circuit of FIG. 2.

In FIG. 4 the averaging circuits 200 and 201 of FIG. 2 have been replaced with averaging circuit/accumulator circuit units 400 and 401. These units 400 and 401 are capable of having their functions changed by changing the computational equations that govern the input/output characteristics of the units. For example, units 400 and 401 are capable of being programmed to perform an averaging function by inserting into the units a transfer function equation for performing an averaging operation (that is, the inputs are added and then that sum is divided by the total number of inputs). Also, units 400 and 401 are capable of being programmed to perform an accumulating function by inserting into the units a transfer function equation for performing an accumulating operation (that is, the sum of the inputs is obtained).

A computer 423 sends control signal on control input lines 457 and 458 to the units 400 and 401, respectively. These control signals indicate to the units 400 and 401 which function to perform (that is, averaging or accumulating) by selecting the appropriate transfer function equation as discussed above.

In order to determine when to switch from the open loop mode to the closed loop mode, the accumulator functions discussed above are necessary. Specifically, during the time when the preamble is being processed by the receiver, the computer 423 sends periodic control signals to the unit 400 so as to switch the unit 400 from performing its averaging function to a situation where it performs its accumulating function. Then, the present output of the accumulating function of the unit 400 is sent along line 498 to the computer 423 so that the computer 423 can evaluate the present output.

The present output of the accumulating function of the unit 400 represents the amount of error that exists between the present sampling timing phase and the correct sampling timing phase. Thus, if the accumulating output 498 of the unit 400 is large (that is, above a certain threshold) then the computer 423 decides that the receiver has not yet been synchronized to the correct sampling timing phase and that thus the preamble must still be passing. Thus, the computer 423 sends a control signal back to the unit 400 so as to program the unit 400 to return to its averaging function. The information used by the unit 400 to perform its averaging function may be stored into an internal temporary register of the unit 400 while the periodic check discussed above is carried out so that after the check is completed the unit 400 may return to the same averaging operation that it was carrying out before the check without any loss of information.

When the computer 423 determines that the accumulator output is below the threshold mentioned above, then the computer knows that the correct sampling timing phase has been acquired and there is no need to carry out further processing in the open loop mode so the receiver may now switch from the open loop mode to the closed loop mode.

The reason why the unit 400 is chosen for performing the periodic check is as follows. The unit 400 receives the n/2 samples that correspond to the zero-crossings of the sine wave shown in FIGS. 3a and 3b. If the sampling timing phase is correct, then these samples will be zero. Thus, by adding up the values of these samples, it can be easily determined whether or not the correct sampling timing phase has been attained by simply checking the magnitudes of the samples.

The performance of this technique in the additive white gain noise (AWGN) channel can readily be analyzed. Let $E_s/N_o$ be the energy per symbol to one-sided noise spectral density ratio. Then each individual sample has a mean of $\sqrt{E_s}$ and a variance $N_o/2$. For Nyquist or integrate-and-dump type filters, samples which are one or more symbols apart are independent. Averaging over n symbols yields a random variable with the same mean and a variance equal to $N_o/2n$. Thus, both $\bar{e}$ and $\bar{o}$ have a variance equal to $N_o/2n$. Converting from Cartesian to polar coordinates, the variance in the angular coordinate is also $N_o/2n$. Therefore, the angle measurement for the half symbol rate sinusoidal waveform has a standard deviation of $1/\sqrt{2nE_s/N_o}$ in radians. Since each symbol duration is half of the period of this sinusoidal waveform, the residual error has a standard deviation of $1/\sqrt{nE_s/2N_o}$ in radians. Note that if we choose $n = R_s/B$, this is exactly the same amount a conventional tuned filter implementation would achieve at the end of the preamble. The new technique, however, requires a preamble of only n bits, which represents a 20-percent reduction from that required by the tuned filter approach.

For an $E_s/N_o$ of 4 dB, a 32-symbol preamble yields a residual error with standard deviation equal to 2.5 percent of the symbol duration, which is quite acceptable for most cases.

Of course, once the initial acquisition is completed, a PLL is employed to maintain the symbol timing. The loop bandwidth of the PLL can be chosen such that the standard deviation of the jitter can be further reduced, if desired.

The technique discussed above is applicable to almost all digital data transmission techniques including baseband non-return to zero, digital FM, phase-shift-keying (PSK), quaternary phase-shift-keying (QPSK), and octal phase-shift-keying (OPSK).

What is claimed is:

1. A method for obtaining a correct sampling timing phase in a digital burst communications receiver during a time when a synchronization preamble section of a data burst transmitted to said receiver is being processed, said processing including the step of sampling said preamble in accordance with said sampling timing phase, said method including steps of:
    (a) averaging samples of said preamble section of said data burst;
    (b) using the results of said step (a) as an address to a memory which stores correction values;
    (c) outputting from said memory an appropriate correction value corresponding to a presently received sampling timing phase in accordance with said address; and
    (d) using said appropriate correction value from said step (c) to alter the phase of the presently received sampling timing phase so as to correct the presently received sampling timing phase to the correct sampling timing phase.

2. A method in accordance with claim 1 wherein said step (a) involves two separate averaging operations.

3. A method in accordance with claim 1 wherein the phase alteration mentioned in step (d) involves a voltage-controlled-oscillator.

4. An apparatus for obtaining a correct sampling timing phase in a digital burst communications receiver during a time when a synchronization preamble section of a data burst transmitted to said receiver is being processed, said apparatus including means for sampling said preamble section in accordance with a present sampling timing phase, said apparatus comprising:

averaging means for averaging samples of said preamble section;
    memory means for storing correction values, said memory means receiving, as an address, results from said averaging means; and
    sampling timing phase correction means for correcting said presently received sampling timing phase to said correct sampling timing phase in accordance with an output from said memory means.

5. An apparatus as claimed in claim 4 wherein said averaging means includes means for simultaneously averaging two groups of samples.

6. An apparatus as claimed in claim 5 wherein one of said groups of samples are odd-numbered samples and the other of said groups are even-numbered samples.

7. An average as claimed in claim 4 wherein said sampling timing phase correction means involves a voltage-controlled-oscillator.

8. A method for obtaining a correct sampling timing phase in a digital burst communications receiver during a time when a synchronization preamble section of a data burst transmitted to said receiver is being processed, including steps of:
    (a) sampling said preamble section of said data burst in accordance with a presently received sampling timing phase;
    (b) averaging samples of said preamble section of said data burst; and
    (c) using the results of said step (b) to correct a presently received sampling timing phase to said correct sampling timing phase.

9. A method in accordance with claim 8 wherein said step (c) comprises using the results of step (b) as an address to a memory which stores correction values and correcting said sampling timing phase accordance with a correction value read out of said memory.

10. A method for obtaining a correct sampling timing phase in a digital burst communications receiver during a time when a synchronization preamble section of a data burst transmitted to said receiver is being processed, said processing including the step of sampling said preamble in accordance with said sampling timing phase, said method including steps of:
    (a) obtaining samples of said preamble section of said data burst;
    (b) using the results of said step (a) as an address to a memory which stores correction values;
    (c) outputting from said memory an appropriate correction value corresponding to a presently received sampling timing phase in accordance with said address; and
    (d) using said appropriate correction value from said step (c) to alter the phase of the presently received sampling timing phase so as to correct the presently received sampling timing phase to the correct sampling timing phase.

11. A method according to claim 10 wherein said step (a) involves obtaining an odd-numbered sample and an even-numbered sample of said preamble section of said data burst.

* * * * *